Jan. 21, 1969 YU GHYL CHANG 3,423,653

INTEGRATED COMPLEMENTARY TRANSISTOR STRUCTURE WITH EQUIVALENT PERFORMANCE CHARACTERISTICS

Filed Sept. 14, 1965

WITNESSES

Theodore F. Wrobel

James F. Young

INVENTOR

Yu Ghyl Chang

BY Gordon H. Telfer

ATTORNEY

United States Patent Office 3,423,653

Patented Jan. 21, 1969

3,423,653

INTEGRATED COMPLEMENTARY TRANSISTOR STRUCTURE WITH EQUIVALENT PERFORMANCE CHARACTERISTICS

Yu Ghyl Chang, Laurel, Md., assignor to Westinghouse Electric Corporation, Pittsburgh, Pa., a corporation of Pennsylvania Filed Sept. 14, 1965, Ser. No. 487,235

U.S. Cl. 317—235 4 Claims

Int. Cl. H01l *11/00; 19/00*

ABSTRACT OF THE DISCLOSURE

This disclosure sets forth a semiconductor integrated circuit structure for providing complementary transistor functions. The structure comprises a unitary structure having first and second electrically isolated portions of semiconductor material with a first transistor of the first polarity in the first portion and a second transistor of a second polarity in the second portion. Each transistor has successively positioned emitter, base and collector regions terminating at a single planar surface. The base-collector regions of one polarity transistor penetrate to a lesser depth from the surface than the base-collector regions of the opposite polarity transistor.

Figure 1:
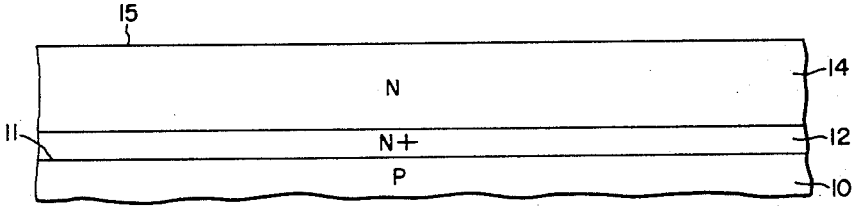

The invention described herein was made in the performance of work under a NASA contract and is subject to the provisions of Section 305 of the National Aeronautics and Space Act of 1958, Public Law 85-568 (72 Stat. 435; 42 USC 2457).

This invention relates generally to semiconductor structures providing the functions of a pair of complementary transistors, and methods of making the same. More particularly, the invention relates to such structures having internal isolation between the complementary transistors.

A variety of electronic circuits utilize junction transistors of both polarities, that is, both NPN and PNP transistors. In fabricating such circuits in integrated form, that is, where the active and passive elements of the circuit are united within a unitary body of semiconductor material, serious difficulty has previously been encountered because the process of fabrication is not wholly compatible with that otherwise used in making integrated circuits having transistors of only one type. Compatible processes that have been proposed may result in transistors having markably different gain and frequency response characteristics which is often undesirable.

In Lin Patent 3,197,710, issued July 27, 1965, there was described a complementary transistor structure wherein transistors of one polarity were formed by laterally disposed emitter and collector regions. This structure is successfully used. The lateral transistor, however, does not have gain and frequency response characteristics like that of the complementary vertically disposed transistor.

A structure and method of forming a complementary transistor with approximately equal characteristics is disclosed in copending application Ser. No. 463,705, now Patent No. 3,327,182, filed June 14, 1965, by Kisinko, assigned to the assignee of the present invention, now Patent 3,327,182, June 20, 1967. The technique and structure described therein uses deposition of doping impurities between two epitaxially grown layers. This technique is sometimes difficult to perform.

It is therefore an object of the present invention to provide an improved complementary transistor structure, particularly for use in integrated circuits, and an improved method of making the same.

Another object is to provide an improved complementary transistor structure having substantially equal gain and frequency response characteristics in the complementary transistors while being readily fabricated by techniques compatible with existing integrated circuit technology.

The invention, in brief, achieves the above-mentioned and additional objects and advantages thereof in a semiconductor structure that includes at least two isolated portions of a first semiconductivity type, each of which includes a major portion of a relatively high resistivity compared with that of an underlying region thereof.

In one isolated portion, assuming the isolated portions to be of N-type semiconductivity, there is formed by diffusion of impurities from the surface thereof a P-type region to serve as the collector of the PNP transistor. The P-type collector extends within the isolated portion to a depth less than that at which the underlying region of lower resistivity is positioned.

P- and N-type emitter and base regions, respectively, are formed by diffusion in the P-type collector region. N and P emitter and base regions, respectively, are formed by diffusion in the other isolated N-type portion that serves as the collector of the NPN transistor. The base of the NPN transistor (where the isolated portions are of N-type) should preferably extend into the body to a greater depth than the base of the PNP transistor. It is preferred that the impurities forming the base regions in each of the transistor structures be simultaneously redistributed.

In accordance with another feature of the invention, PNP transistors may be formed in NPN oriented structures (that is, where isolated portions of material are of N-type semiconductivity) even though no NPN transistors are needed. This is quite advantageous because the fabrication of PNP structures by merely reversing the conductivity type of the regions of a conventional NPN structure is difficult.

The invention, together with the above mentioned and additional objects and advantages will be better understood by reference to the following description taken with the accompanying drawing wherein:

FIGS. 1 through 6 are partial sectional views of a semiconductor integrated circuit at successive stages in the fabrication process in accordance with this invention.

The invention will be described particularly as applied to the fabrication of integrated circuits in silicon, thus illustrating its compatibility with existing integrated circuit fabrication techniques. It is to be understood, however, that other semiconductor materials may be used. Furthermore, the invention will be described in embodiments wherein individual regions are described as having a particular type of semiconductivity because present commercial practice makes such an arrangement preferred although the semiconductivity of the various regions may be reversed from that shown.

FIG. 1 shows a semiconductor body including a P-type substrate 10, and N+-type layer 12 on a major surface 11 of the P-type substrate and an N-type layer 14 on the N+ layer. The structure as shown in FIG. 1 may be like that conventionally employed in producing integrated circuit structures that include transistors of only one type. The P-type substrate 10 provides a mechanical support, the N+ layer 12 is present primarily to reduce saturation resistance in NPN transistor structures and the N-type layer 14 is that in which subsequent diffusion operations are performed to produce the various regions and junctions of the active and passive elements of the structure.

In the fabrication of structures in accordance with this invention, a plurality of selective diffusion operations are performed on the surface 15 of the body of starting material. Each of these operations may be performed by conventional techniques and will not be extensively described herein. Briefly, the selectively diffused regions may be formed by first producing a layer of silicon dioxide on the surface 15 of the silicon body as by thermal oxidation. Windows within the oxide layer are formed where diffused regions are desired by photolithographic techniques. The structure is exposed to a vapor containing impurities of the type desired to form the diffused region. Impurities deposit on the surface 15 of the silicon within the window in the oxide.

After the deposition of impurities has been performed for a time sufficient to deposit the required quantity of impurities, the structure is removed from the atmosphere containing impurities and in a nonimpurity containing atmosphere that includes an oxidant the structure is heated for a time sufficient to redistribute the previously deposited impurities and produce the diffusion profile desired. At the same time, the silicon dioxide layer is reformed to permit continuous protection of the diffused regions and to permit successive oxide diffusion masks to be formed. If the desired diffusion profile is achieved in the deposition operation itself then the oxide layer may be reformed by a low temperature process such as deposition from a vapor by a pyrolytic reaction. The various oxide layers employed as diffusion masks and to protect the surface of the structure have been omitted from FIGS. 1 to 5.

Figure 2:
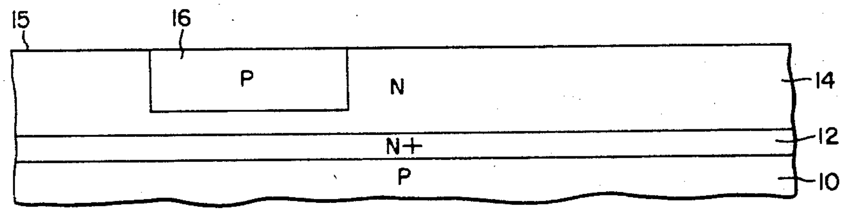

FIG. 2 shows the structure after a P-type region 16 has been formed by selective diffusion within the N-type layer 14. The P-type region 16 is that which serves as the collector of the PNP transistor in the structure. It should penetrate well within the N-type layer 14 but it should not reach to the N+-type layer 12. It has been found that if the P-type collector 16 extends to the N+ layer 12 parasitic capacitance may exist between regions 16 and 12 and 10 to such an extent to cause defective operation of the integrated circuit. The illustrated structure also minimizes parasitic transistor action between regions 16, 12 and 10. This problem is most likely to occur with amplifier integrated circuits that have not been treated, as by gold diffusion, to reduce the lifetime of minority carriers.

Figure 3:
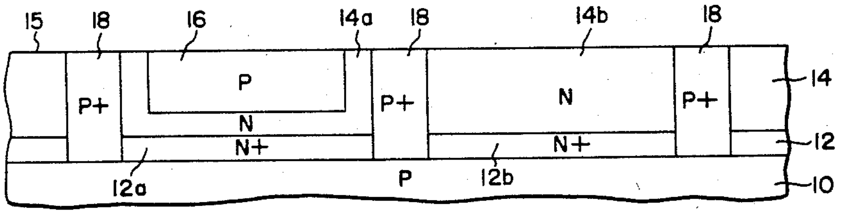

FIG. 3 shows the structure after P+ isolation walls 18 have been formed extending from the exposed surface through both the N and N+ layers 12 and 14 to the substrate 10. The P+ diffusion for the isolation walls 18 is in a pattern to define the elements of the integrated circuit that are to be electrically isolated from each other. Isolated portions **12*a* and 12*b* of layer 12 and 14*a* and 14*b* of layer 14 are thereby formed. The structural portion formed on N and N+ layer portions 14*b* and 12*b* in the right-hand part of the structure will be in the position of the NPN transistor while the isolated N and N+ layer portions 14*a* and 14*b*** in the left-hand part of the structure will be the position of the PNP transistor.

The P+ isolation walls are formed by depositing a very large quantity of impurities (for example about $10^{21}$ atoms per cubic centimeter) in the desired position that produces a rapidly moving diffusion front that will exceed that of the previously formed P-type collector 16 region by reason of the difference in impurity concentration even though the same impurity is used. The deposition for the collector region 16 is limited to about $10^{18}$ atoms per cubic centimeter, for example.

Figure 4:
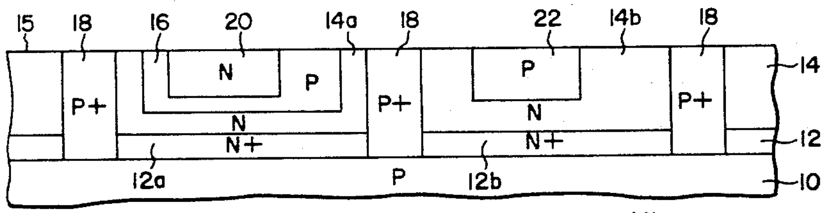

FIG. 4 shows the structure after an N-type base region 20 has been formed in the P-type collector region 16 and a P-type base region 22 has been formed in the N-type collector region **14*b*. These regions, as they require different types of impurities, are formed in separate impurity deposition operations. However, both types of impurities may be redistributed in a single heating operation. The P-type base region 22 is shown to a greater depth than the N-type base region 20** as that has been found to be important in order to achieve good, relatively closely matched, frequency response in both the PNP and NPN transistors.

Figure 5:
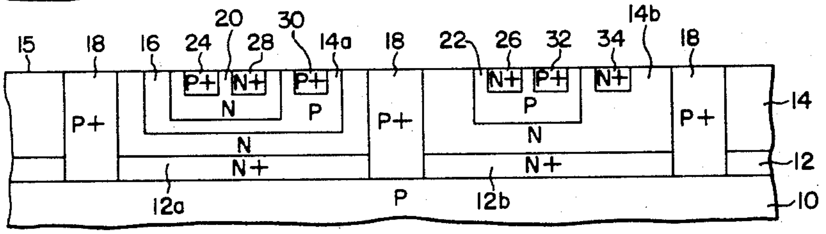

FIG. 5 shows the structure after a P+ emitter region 24 has been formed in the N-type base region 20 and an N+ emitter region 26 has been formed in the P-type base region 22. Also, N+ and P+ contacting regions 28 and 30 have been applied respectively to the N-type base 20 and P-type collector 16 and P+ and N+ contacting regions 32 and 34 have been formed, respectively, in the P-type base and N-type collector regions 22 and **14*b*. The regions 28, 30, 32 and 34 are provided to facilitate the forming of good ohmic contacts to the various regions and to reduce the saturation resistance of the transistors. All of the N+ regions 26, 28 and 34 may be formed in a single deposition and diffusion operation after which the P+ regions 24, 30 and 32** may be similarly formed.

Figure 6:
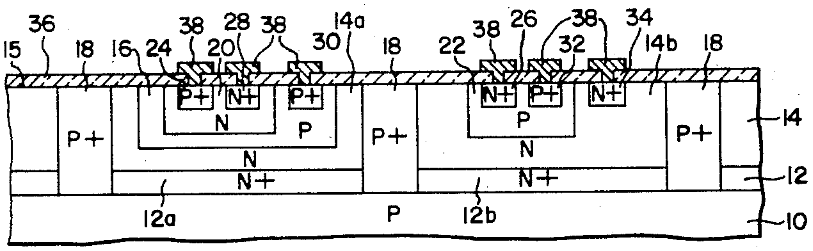

FIG. 6 shows the structure including the final passivation layer 36 of silicon dioxide on surface 15 that acts as a contact mask in the forming of ohmic metallic contacts 38 to each of the emitter, base and collector regions thus completing the essentials of the structure.

It will be noted that the techniques employed in making the structure of FIG. 6 are thoroughly compatible with existing integrated circuit fabrication. Furthermore, it is also possible to form at the same times the P-type collector region is formed P-type regions in other isolated N-type portions to serve as high Q junction capacitors.

With the fabrication process described, PNP transistors wiht $f_t$ in excess of 350 mc. and collector saturation voltages of less than 0.2 volt have been obtained. Success in forming good NPN transistors in such a structure is of course inherent as with existing technology. Now because of the ability to form correspondingly good PNP transistors much greater circuit design flexibility is possible.

Structures were made as described wherein the P-type substrate 10 was of boron doped silicon having a resistivity of about 20 ohm-centimeters and a major surface orientation near <111>. The N+ and N-type layers 12 and 14 were produced by epitaxial growth operations involving the thermal decomposition with hydrogen of silicon tetrachloride with a controlled amount of arsenic compound included for doping. The N+ layer 12 was about 3 microns thick and had a resistivity of about 0.04 ohm-centimeter while the N-type layer 14 was about 14 microns thick and had a resistivity of about 0.3 ohm-centimeter.

The structure was oxidized by thermal oxidation to produce a silicon dioxide layer having a thickness of approximately 8,000 angstroms. The P-type collector diffusion for region 16 was performed using a boron compound as the impurity source to a sheet resistivity of about 200 ohms per square and a junction depth of about 3 microns. All of the P-type regions were formed by using boron as the doping impurity and the N-type regions formed using phosphorus as the doping impurity. The N-type base region 20 was formed by depositing impurities to a sheet resistivity of about 200 ohms per square and the P-type base region 22 was formed by an impurity deposition to a sheet resistivity of about 50 ohms per square. During the redistribution of impurities in a single heating operation the N-type base region junction was formed at about 2.5 microns while the P-type base junction was formed at about 3.5 microns having resultant sheet resistivities of about 100 and 200 ohms per square, respectively. The emitter regions 24 and 26 and contacting regions 28, 30, 32 and 34 were formed to a depth of about 2 microns with a sheet resistivity of about 5 ohms per square. The ohmic contacts 38 were formed of aluminum bonded to the silicon.

Structures in accordance with this invention are particularly suitable for use in high frequency amplifiers and fast speed logic circuits such as bridge-type multivibrators and flip-flops. Typical electrical characteristics of PNP transistors formed in accordance with this invention are as follows:

| | |
|---|---|
| $BV_{ceo}$, volts | 15 |
| $BV_{ebo}$, volts | 8 |
| $F_t$, mc. | 350 |
| $V_{ce}$ (sat.), volt | 0.2 |
| $h_{fe}$ | 50 |

Using a junction formed betwen a region formed like the collector 16 of the PNP transistor and region formed like the emitter 26 of the NPN transistor, a capacitor having high capacitance per unit area, low series resistance and high breakdown capacitance can be obtained. At zero bias condition, a capacitance of 0.65 picofarad per square mil is obtained with a reverse junction breakdown in excess of 25 volts.

The P+ contacting region 32 in the base 22 of the NPN transistor has been found particularly valuable in avoiding a problem that would otherwise occur because of the great thickness of the oxide layer that has to be removed to form the contact mask 36. By opening windows for the P+ diffusion prior to the final contact window opening, the residual glassy insulating layers can be minimized and more satisfactory ohmic contacts obtained.

The P+ diffusion can also be used in fabricating precision P-type resistors where corner effects are to be avoided. The portion of an integrated resistor where the resistive path turns presents an uncertain amount of resistance that is difficult to control. By a low resistivity P+ diffusion in these areas of uncertainity, their resistance contribution is negligible and more precise resistors can be formed.

Since the frequency response of a power amplifier depends not only on $F_t$ but also on the $r_b'C_e$ product the contacting regions 28 and 32 on the base regions 20 and 22 of both transistors are valuable in increasing $f_t$.

Instead of using a body of starting material as described with layers 12 and 14 both being epitaxially grown on the substrate 10; it is also suitable to form layer 12 by diffusion. Alternatively, layer 12 may be replaced by selectively diffused N+ regions formed where desired, e.g., as part of collectors of NPN transistors (equivalent to N+ portion 12*b*).

The description of the present invention has been primarily directed to a structure using PN junction isolation between the two transistors. However, it is to be understood that other isolation techniques, particularly those employing a dielectric medium such as a silicon dioxide layer as described in copending application Ser. No. 410,666, filed Nov. 12, 1964, by Murphy et al., and assigned to the assignee of the present invention now abandoned, may also be used in practicing this invention.

It is therefore seen how the present invention greatly facilitates formation of complementary transistors in integrated circuits. In addition, a solution is provided to the problems of providing integrated circuit where in all the transistors are PNP. Commerical integrated circuits are NPN oriented because of greater ease of forming N-type epitaxial layers and a good P-type diffusion for transistor bases and resistors than the corresponding operations in a PNP oriented structure.

While the invention has been shown and described in a few forms only, it will be understood that various changes and modifications may be made without departing from the spirit and scope thereof.

What is claimed is:

1. A semiconductor integrated circuit structure for providing complementary transistor functions comprising: a unitary structure including first and second electrically isolated portions of semiconductive material; a first transistor of a first polarity in said first portion and a second transistor of a second polarity in said second portion, each transistor including emitter, base and collector regions with junctions therebetween terminating at a single planar surface, said regions of each transistor being successively positioned from said surface; the collector of said first transistor being disposed within said first isolated portion to less than the full extent thereof; said second isolated portion providing the collector of said second transistor; the base region of said second transistor penetrating to a greater depth from said surface than the base region of said first transistor.

2. A semiconductor integrated circuit structure in accordance with claim 1 wherein:

each of the base and collector regions of said transistors have thereon contacting regions of semiconductivity of the same type as the respective region and of appreciably lower resistivity.

3. A semiconductor integrated circuit structure in accordance with claim 1 wherein: said second isolated portion comprises a first zone adjacent said base region of a first resistivity and a second zone underlying said first zone of a resistivity less than said first resistivity.

4. A semiconductor integrated circuit structure in accordance with claim 3 wherein: said first and second isolated portions are of material having the same thickness and resistivity profile and said collector of said first transistor is disposed within said first isolated portion to a depth less than that at which the second zone thereof is positioned.

References Cited

UNITED STATES PATENTS

| | | | |
|---|---|---|---|
| 3,197,710 | 7/1965 | Lin | 330—38 |
| 3,275,846 | 9/1966 | Bailey | 307—88.5 |
| 3,310,711 | 3/1967 | Hangstefer | 317—101 |
| 3,319,174 | 5/1967 | Hellstrom | 330—17 |

JOHN W. HUCKERT, *Primary Examiner.*

R. SANDLER, *Assistant Examiner.*

U. S. Cl. X.R.

317—101